US007053636B2

(12) United States Patent
Sudin

(10) Patent No.: US 7,053,636 B2
(45) Date of Patent: May 30, 2006

(54) PROBE DEVICE FOR ELECTRICAL TESTING AN INTEGRATED CIRCUIT DEVICE AND PROBE CARD USING THE SAME

(75) Inventor: Hendra Sudin, Chu-Pei (TW)

(73) Assignee: MJC Probe Incorporation, (TW)

( * ) Notice: Subject to any disclaimer, the term of this patent is extended or adjusted under 35 U.S.C. 154(b) by 0 days.

(21) Appl. No.: 10/709,723

(22) Filed: May 25, 2004

(65) Prior Publication Data

US 2005/0200375 A1 Sep. 15, 2005

(30) Foreign Application Priority Data

Mar. 10, 2004 (TW) .............................. 93106392 A

(51) Int. Cl.
*G01R 31/02* (2006.01)

(52) U.S. Cl. .................... 324/754; 324/758; 324/158.1

(58) Field of Classification Search .................... 324/1, 324/750–765

See application file for complete search history.

(56) References Cited

U.S. PATENT DOCUMENTS 4,908,571 A * 3/1990 Stoehr ........................ 324/758
5,208,993 A * 5/1993 Harding ........................ 33/559
5,473,254 A * 12/1995 Asar ........................ 324/537
5,505,005 A * 4/1996 McMurtry et al. ............ 33/561
5,914,613 A 6/1999 Gleason
6,084,420 A * 7/2000 Chee ........................ 324/754
6,617,865 B1 * 9/2003 Di Stefano ................. 324/754
6,643,944 B1 * 11/2003 Yoda et al. ................... 33/558
6,781,382 B1 * 8/2004 Johnson ...................... 324/426
6,781,392 B1 * 8/2004 Cheng et al. ............... 324/754
2004/0124861 A1 * 7/2004 Zaerpoor .................... 324/754

* cited by examiner

*Primary Examiner*—Vinh Nguyen
*Assistant Examiner*—Emily Y Chan
(74) *Attorney, Agent, or Firm*—Connolly Bove Lodge & Hutz LLP; Larry J. Hume

(57) ABSTRACT

The present probe device comprises an insulative body, at least one supporter positioned in the insulative body, a probe positioned substantially at the center of the supporter, and a conductive wire positioned in the insulative body and electrically connected to the supporter. The supporter can be a helical spring, which connects to the probe with its inner end and to the insulative body with its outer end. In addition, the supporter may include a plurality of beams, which connects to the probe at one end and to the insulative body at the other end. The beams are positioned in a radial manner with the probe at the center, and the included angle between two adjacent beams is substantially the same. The supporter can further comprise at least one ring connecting the plurality of beams.

6 Claims, 16 Drawing Sheets

10
26
20
24
12
28
22
23
14

PROBE DEVICE FOR ELECTRICAL TESTING AN INTEGRATED CIRCUIT DEVICE AND PROBE CARD USING THE SAME

BACKGROUND OF THE INVENTION

Embodiments of this disclosure relate to a probe device for electrical testing an integrated circuit device and probe card using the same, and more particularly to a probe device for electrical testing an integrated circuit device and probe card capable of adjusting the probe pressure applied on an integrated circuit device under test by the probe and aligning the probe along the center line automatically.

Generally, it is necessary to test the electrical characteristic of integrated circuit devices on the wafer level for checking whether the integrated circuit device satisfies the product specification. Integrated circuit device with electrical characteristic satisfying the specification will be selected to carry on the subsequent packaging process, and the other devices will be discarded to avoid additional packaging cost. Another electrical property test will be performed on the integrated circuit device after the packaging process is completed to sieve out the disqualified devices to increase the product yield.

There are two major types of probes according to the prior art, i.e., the cantilever probe and the vertical probe. The cantilever probe provides appropriate vertical displacement when the probe tip contacts an integrated circuit device under test via a cantilever contact structure to prevent the integrated circuit device under test from excessive probe pressure applied by the probe tip. However, the cantilever contact structure occupies a larger planar space in a matrix array probing, which constrains the cantilever probe to be arranged in a fine pitch manner corresponding to the integrated circuit device under test with the high density of pin, therefore it cannot be applied to the testing of the integrated circuit device with high density of pin.

The vertical probe offers the vertical displacement required by the probe tip to contact the integrated circuit device under test using the deformation of the probe body itself, and can be arranged in a fine pitch manner corresponding to the integrated circuit devices under test with high density of pin. However, if the deformation of the probe body is so large, adjacent probes may contact each other and causes short circuit or collision.

U.S. Pat. No. 5,914,613 discloses an elastic membrane testing module for testing electrical characteristic of the integrated circuit device. The elastic membrane testing module includes several probes positioned on an elastomeric layer, and provides all probes a proper vertical moving displacement via the elastomeric layer to adjust a probe pressure, which is enough to scrape an oxide layer on the pad as each probe contacts the pad of the integrated circuit device under test. However, the moving displacement provided by the elastomeric layer cannot be self adjustable individually for each probe to conform with the irregularities of testing pads or bumps, and thus cause the moving displacements are different from one to another; the moving displacement is larger at the center of the elastomeric layer and relatively smaller around the peripheral of the integrated circuit device. Consequently, the probe at the center may apply an excessive probe pressure to damage the pad, while the probe around the peripheral may not be enough to scrape the oxide layer on the pad. That is, the probes cannot scrape the oxide layer on the pad evenly and the impedances are different. Additionally, since the elastomeric layer is a multilayer structure and consists of several materials, the thermal expansion coefficient difference between different materials limits application of the elastic membrane testing module in high temperature electrical property measurement.

BRIEF SUMMARY OF THE INVENTION

One objective of this disclosure is to provide a probe device for electrical testing an integrated circuit device and probe card capable of self adjustable of each probe pressure applied on an integrated circuit device under test by the probe and aligning the probe along the center line automatically.

In order to achieve the above-mentioned objective, and avoid the problems of the prior art, the present probe device comprises an insulative body, at least one supporter positioned in the insulative body, a probe positioned substantially at the center of the supporter, and a conductive wire positioned in the insulative body and electrically connected to the supporter. The supporter can be a helical spring, which connects to the probe with its inner end and to the insulative body with its outer end. In addition, the supporter can comprise a plurality of beams, which connects to the probe at one end and to the insulative body at the other end. The beams are positioned in a radial manner with the probe substantially at the center, and the included angle between two adjacent beams is substantially the same. The supporter can further comprise at least one ring connecting the beams.

The probe card of the present invention comprises a circuit board and a probe head. The circuit board comprises a plurality of test-connecting sites for connecting to a testing machine and a plurality of conductive paths positioned in the circuit board for connecting the test-connecting site to the bottom surface of the circuit board electrically. The probe head comprises an insulative body, at least one supporter positioned in the insulative body, a probe positioned substantially at the center of the supporter, and a conductive wire positioned in the insulative body and electrically connected to the supporter.

In addition, the probe card of the present invention can comprise a circuit board, a probe head and an interface board connecting the circuit board and the probe head. The circuit board comprises at least one test-connecting site, while the probe head comprises an insulative body, at least one supporter positioned in the insulative body, a probe positioned substantially at the center of the supporter, and a conductive wire positioned in the insulative body and electrically connected to the supporter. The interface board comprises at least one first signal-connecting site positioned on the upper surface for connecting to the signal-connecting site of the circuit board, and at least one second signal-connecting site positioned on the bottom surface for connecting to the conductive wire of the probe device.

Compared with the prior art, the probe device of the present invention uses the supporter with vertical and lateral elasticity to support the probe for probing the integrated circuit device under test. The probe is so restricted by the lateral elasticity of the supporter that the probe is only allowed to move substantially in the vertical direction to avoid the lateral movement. Consequently, the present probe device enables the probe to align along the center line of the supporter automatically to ensure the lateral stability of the probe. In addition, the vertical elasticity offered by the supporter enables each probe of the probe head to move independently in the vertical direction to softly contact the pad of the integrated circuit device, and individually self-adjusts the probe pressure applied on the pad of the integrated circuit.

BRIEF DESCRIPTION OF THE DRAWINGS

Other objectives and advantages of the present invention will become apparent upon reading the following description and upon reference to the accompanying drawings in which:

FIG. 2(*b*) illustrates a probe device according to the third embodiment of the present invention;

FIG. 2(*c*) illustrates a probe device according to the fourth embodiment of the present invention;

FIG. 3(*b*) illustrates a probe device according to the sixth embodiment of the present invention;

DETAILED DESCRIPTION

Figure 1:
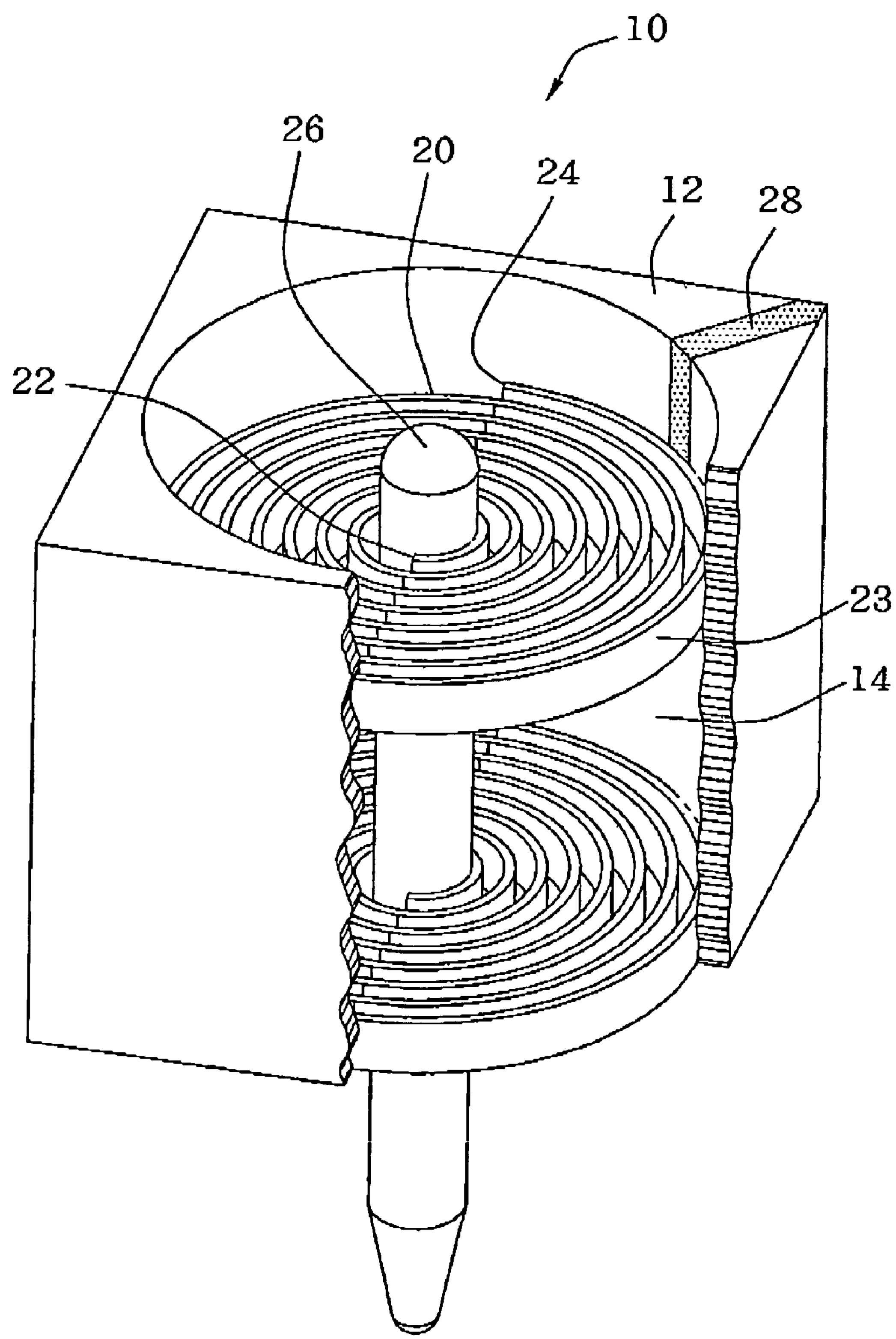
FIG. 1 illustrates a probe device according to the first embodiment of the present invention.

FIG. 1 illustrates a probe device 10 for electrical testing an integrated circuit device according to the first embodiment of this disclosure. As shown in FIG. 1, the probe device 10 comprises an insulative body 12 with a circular opening 14, two supporters 20 positioned in the opening 14, a probe 26 positioned in the supporter 20, and a first conductive wire 28 positioned in the insulative body 12 and electrically connected to the supporter 20. The supporter 20 is a helical spring with a spiral coil 23 extending substantially at the same plane and having an inner end 22 connected to the probe 26 and an outer end 24 connected to the insulative body 12. Particularly, there are two supporters 20 positioned substantially in parallel inside the opening 14 of the insulative body 12. When the probe 26 deviates from the center of the supporter 20, the lateral elasticity of the helical spring will push the probe 26 back to central position automatically, i.e., the helical spring can limit and restrict the probe 26 to move substantially only in vertical direction to avoid the disadvantage caused by lateral movement of the probe as in the conventional art.

Furthermore, when the probe tip of the probe 26 contacts an integrated circuit device under test, the vertical elasticity of the spiral coil 23 can automatically adjust the probe pressure applied by the probe 26 on the integrated circuit device. That is, since the present invention uses the elastic supporter 20 to support the probe 26, the contact between the probe 26 and the integrated circuit device is a soft contact rather than a hard contact, which will damage the integrated circuit device. The probe 26 and the supporter 20 are made of an elastic and conductive material. Preferably, the probe 26 and the supporter 20 are made of a materials selected from the group consisting of copper, nickel, cobalt, tin, boron, phosphorus, chromium, tungsten, molybdenum, bismuth, indium, cesium, antimony, gold, silver, rhodium, palladium, platinum, ruthenium and their alloys. An electric signal of the integrated circuit device under test is acquired by the probe 26, and then outputs via the supporter 20 and the first conductive wire 28 outwards.

Figure 2A:
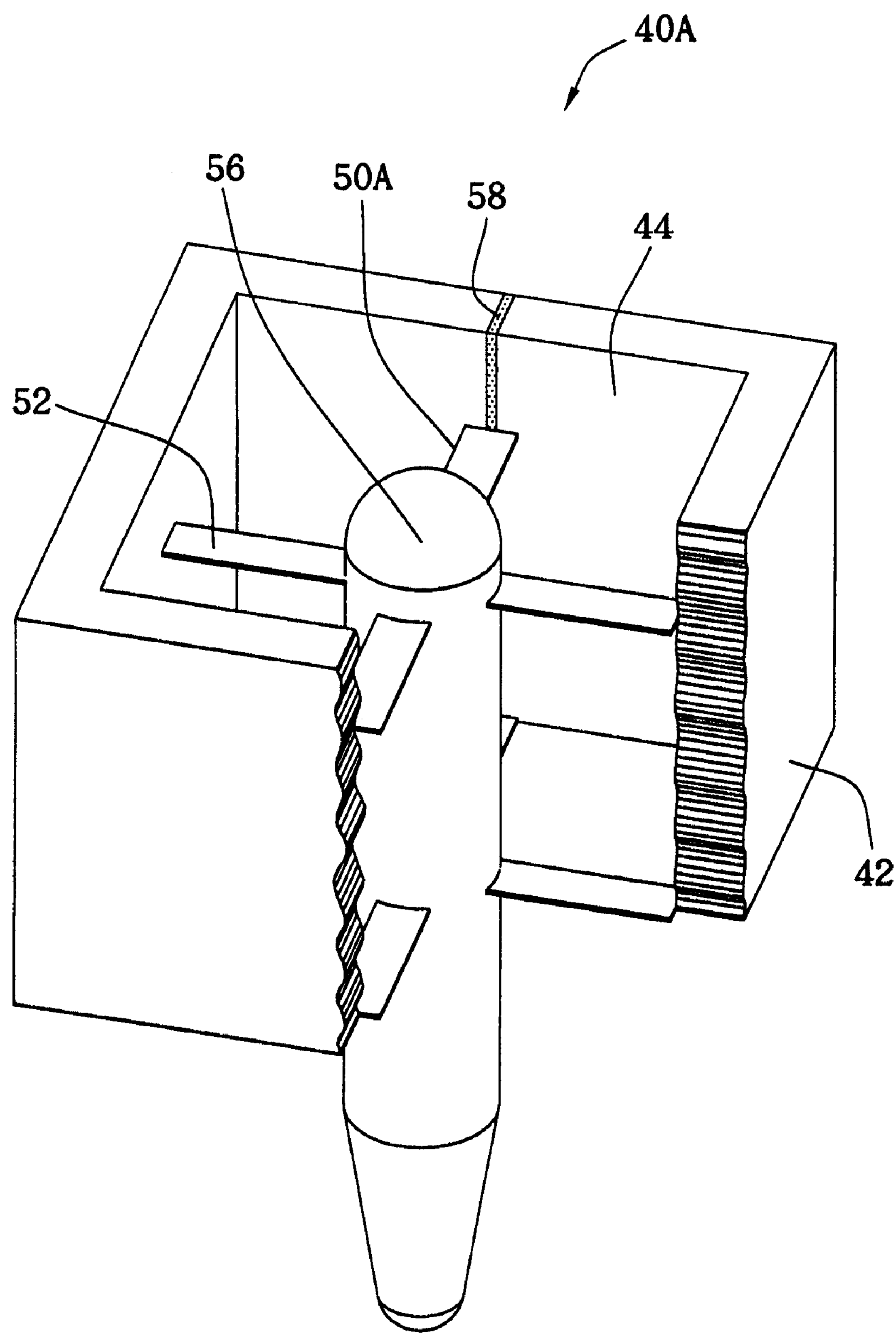
FIG. 2(*a*) illustrates a probe device according to the second embodiment of the present invention.
Figure 2B:
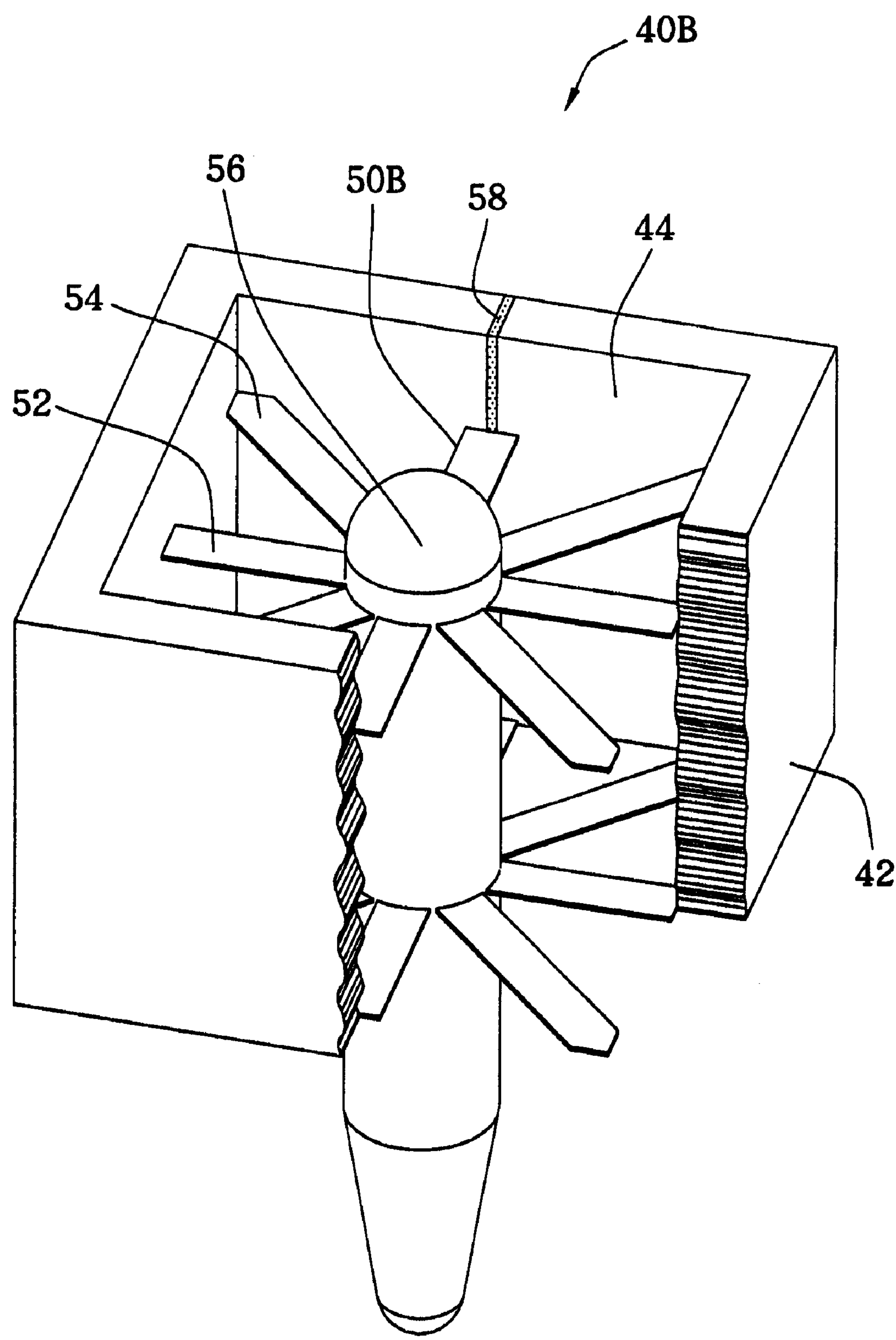
Figure 2C:
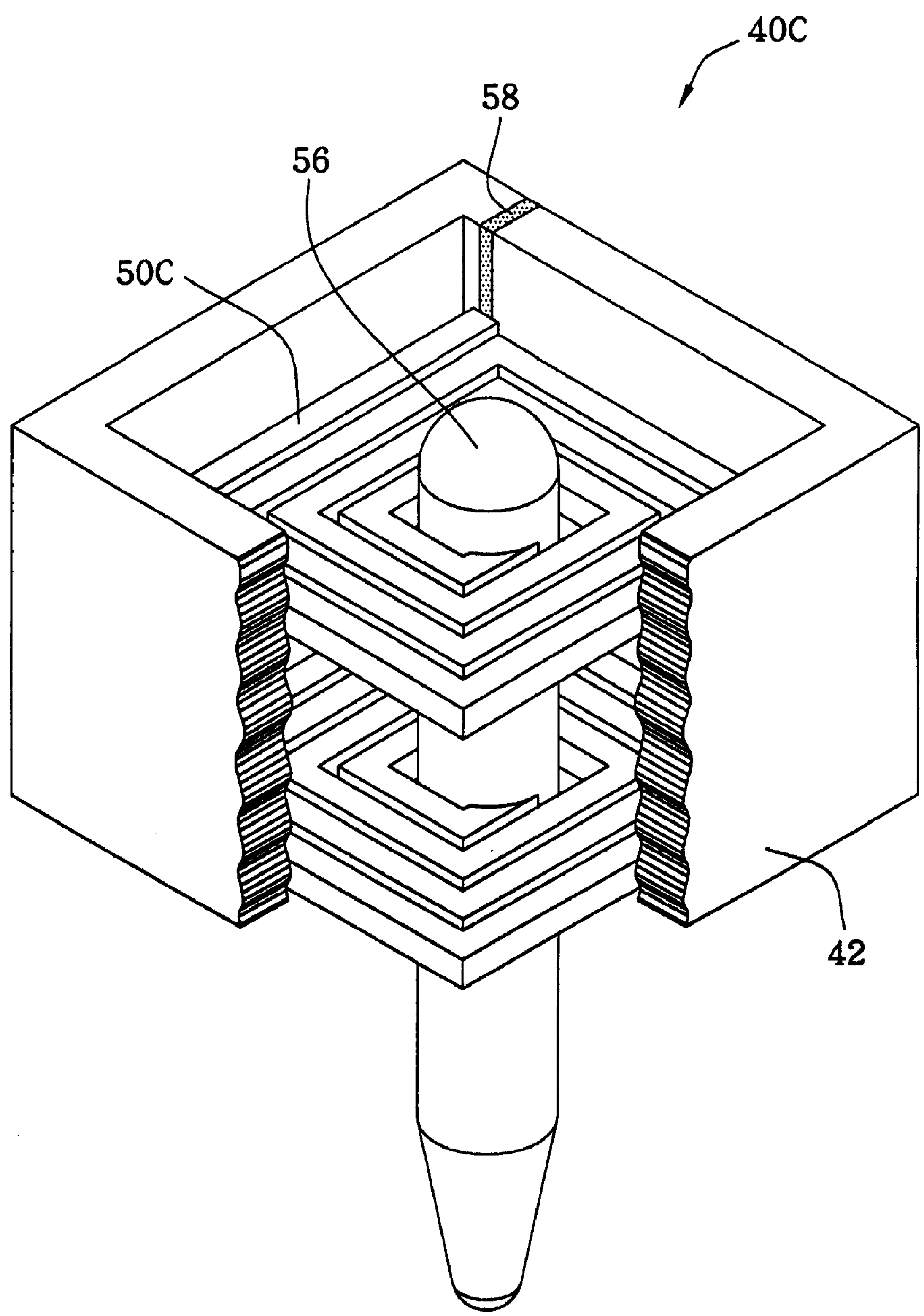

FIG. 2(*a*) illustrates a probe device 40A according to the second embodiment of the present invention. As shown in FIG. 2(*a*), the probe device 40A comprises an insulative body 42 with a quadrangular opening 44, two supporters 50A positioned in the opening 44, a probe 56 positioned in the supporter 50A, and an first conductive wire 58 positioned in the insulative body 42 and electrically connected to the supporter 50A. The supporter 50A comprises four beams 52 positioned in a radial manner with the probe 56 substantially at the center and the included angle between two adjacent beams 52 is the same, substantially 90 degrees. That is, four beams 52 form a cross structure, while the probe 56 is located at the center of the cross structure. One end of the beam 52 is connected to the probe 56, the other end is connected to the insulative body 52, and one of the four beams 52 is connected to the first conductive wire 58 and the probe 56 electrically. Particularly, there are two supporters 50A positioned substantially in parallel inside the opening 44 of insulative body 42.

FIG. 2(*b*) illustrates a probe device 40B according to the third embodiment of the present invention. Compared with FIG. 2(*a*), the supporter 50B of the probe device 40B shown in FIG. 2(*b*) consists of two types of beams: four beams 52 and four beams 54 arranged in an alternative manner. The included angle between the beam 52 and the beam 54 is substantially 45 degrees. One end of the first conductive wire 58 is connected to one of the beams 52 electrically for transmitting test signal the probe 56, or transmitting the electric signal acquired by the probe 56 from an integrated circuit device under test outwards.

FIG. 2(*c*) illustrates a probe device 40C according to the fourth embodiment of this disclosure. Compared with FIG. 2(*a*), the supporter 50C of the probe device 40C shown in FIG. 2(*c*) comprises an upper and a lower square helical springs. The inner end of the square helical spring is connected to the probe 56, and the outer end is connected to the insulative body 42. Preferably, the probe 56 is located at the center of the square helical spring. The first conductive wire 58 is connected the outer end of upper helical spring electrically for transmitting test signal to the probe 56, or transmitting the electric signal acquired by the probe 56 from an integrated circuit device under test outwards.

Figure 3A:
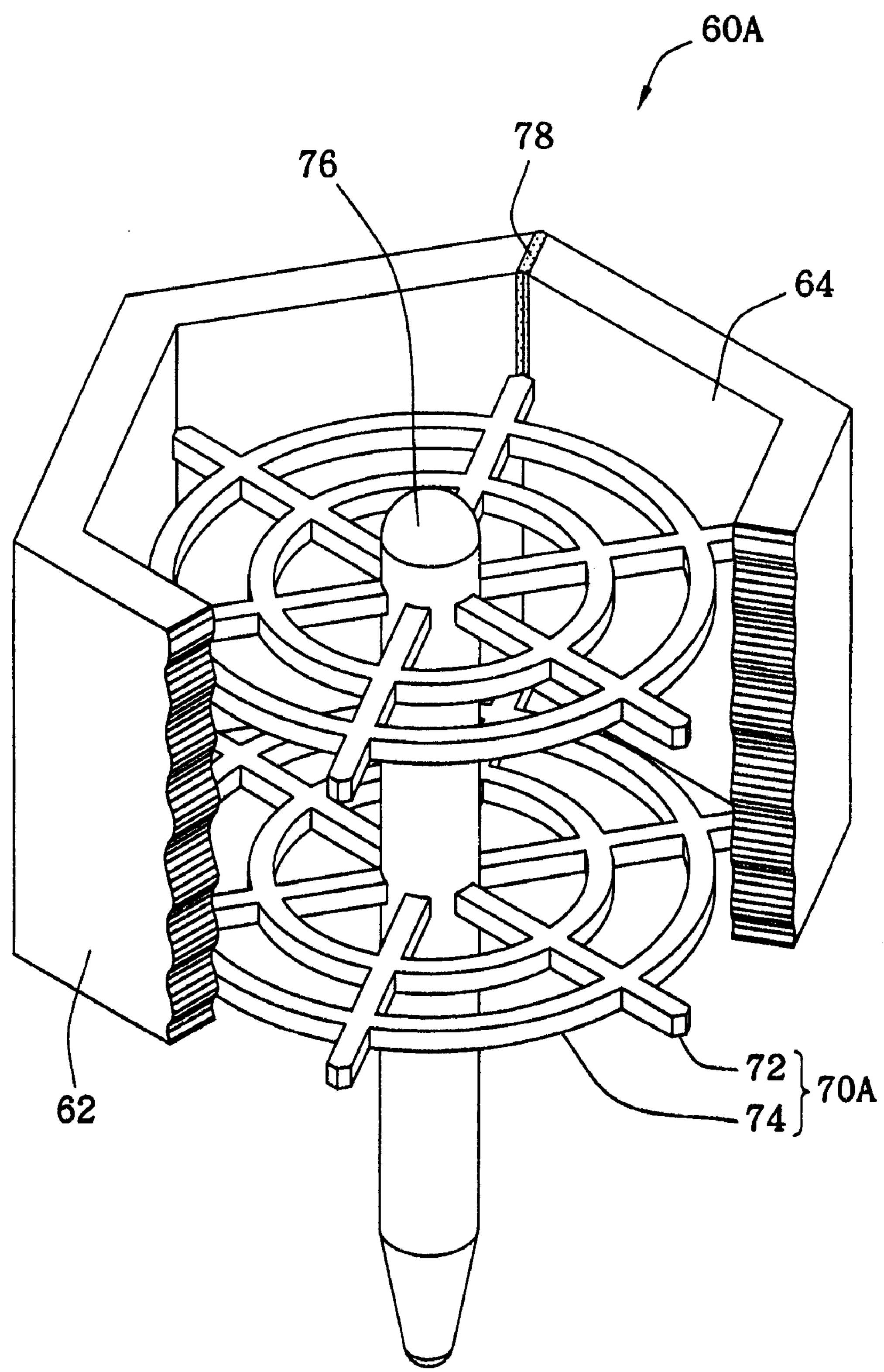
FIG. 3(*a*) illustrates a probe device according to the fifth embodiment of the present invention.
Figure 3B:
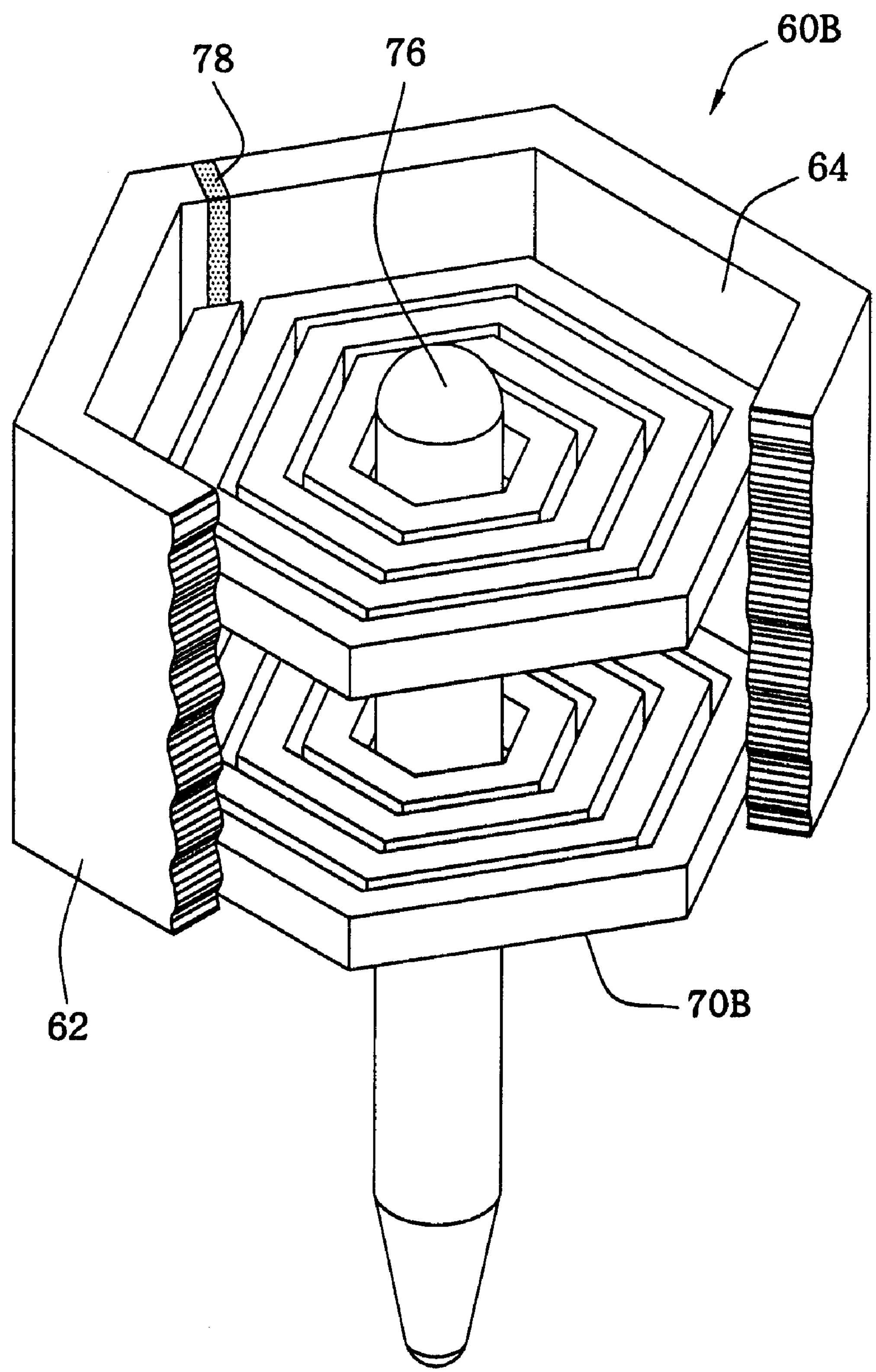

FIG. 3(*a*) illustrates a probe device 60A according to the fifth embodiment of the present invention. As shown in FIG. 3(*a*), the probe device 60A comprises an insulative body 62 with a hexagonal opening 64, two supporters 70A positioned in the opening 64, a probe 76 positioned in the supporter 70A, and a first conductive wire 78 positioned in the insulative body 62 and electrically connected the supporter 70A. The supporter 70A comprises six beams 72 and two rings 74 connecting the six beams 72. One end of the beam

72 is connected the probe 76, the other end is connected to the insulative body 62, and one of the beams 72 is connected to the first conductive wire 78 and the probe 76 electrically. The six beams 72 are positioned in a radial manner with the probe 76 substantially at the center, and the included angle between two adjacent beams 72 is the same, substantially 60 degrees.

FIG. 3(*b*) illustrates a probe device 60B according to the sixth embodiment of the present invention. Compared with FIG. 3(*a*), the supporter 70B of the probe device 60B shown in FIG. 3(*b*) comprises an upper and lower hexagonal helical springs. The inner end of the hexagonal helical spring is connected to the probe 76, and the outer end is connected to the insulative body 62. Preferably, the probe 76 is located at the center of the hexagonal helical spring. The first conductive wire 78 is connected the outer end of upper hexagonal helical spring electrically for transmitting test signal to the probe 76, or transmitting the electric signal acquired by the probe 76 from an integrated circuit device under test outwards.

Figure 4:
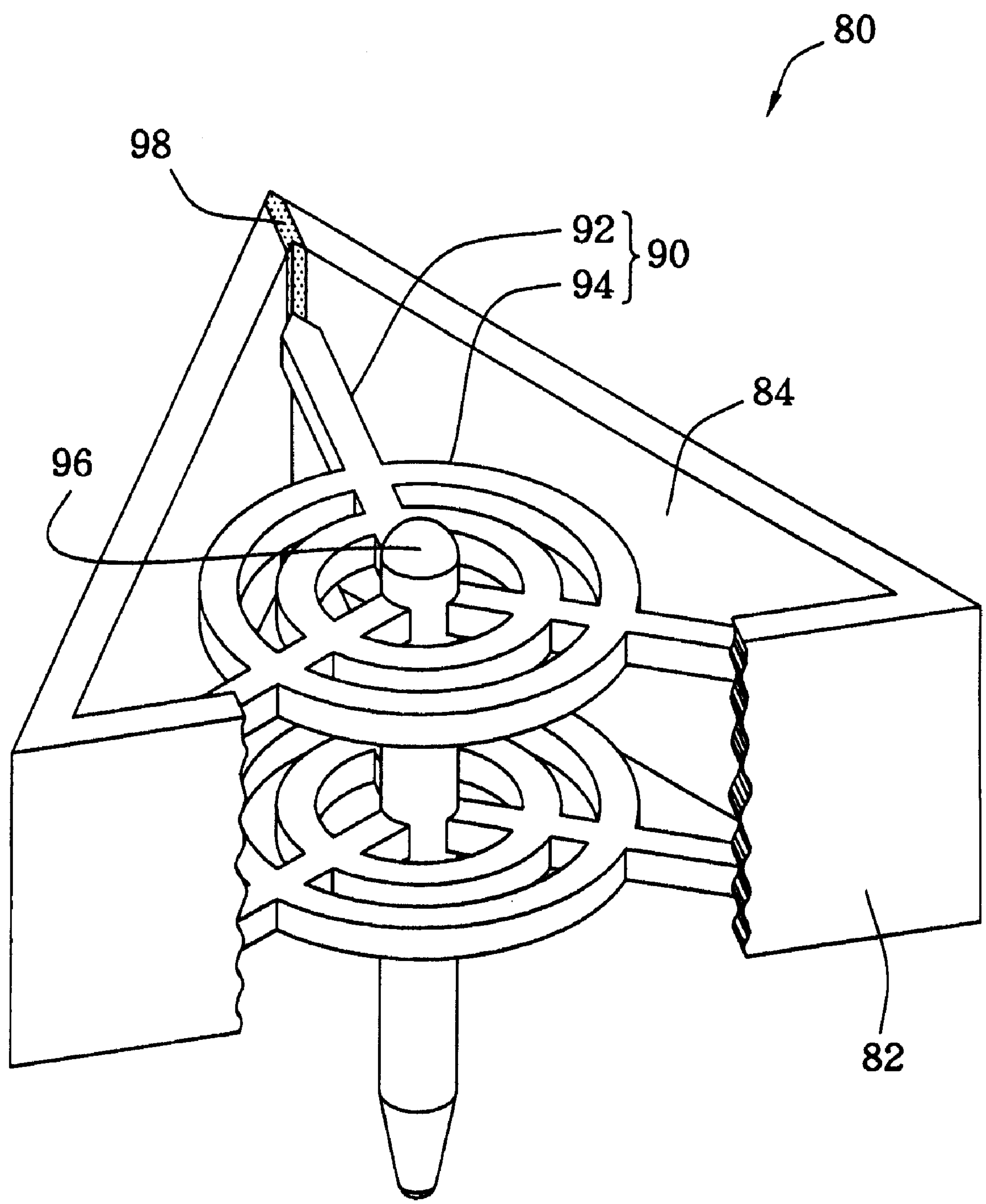
FIG. 4 illustrates a probe device according to the seventh embodiment of the present invention.

FIG. 4 illustrates a probe device 80 according to the seventh embodiment of the present invention. As shown in FIG. 4, the probe device 80 comprises an insulative body 82 with a triangular opening 84, two supporters 90 positioned in the opening 84, a probe 96 positioned in the supporter 90, and a first conductive wire 98 in the insulative body 82 and electrically connected to the supporter 90. The supporter 90 comprises three beams 92 and two rings 94 connecting the three beams 92. One end of the beam 92 is connected the probe 96, the other end is connected to the insulative body 82, and one of the beams 92 is connected to the first conductive wire 98 and the probe 96 electrically. The three beams 92 are positioned in a radial manner with the probe 96 substantially at the center, and the included angle between two adjacent beams 92 is the same, substantially 120 degrees.

Figure 5:
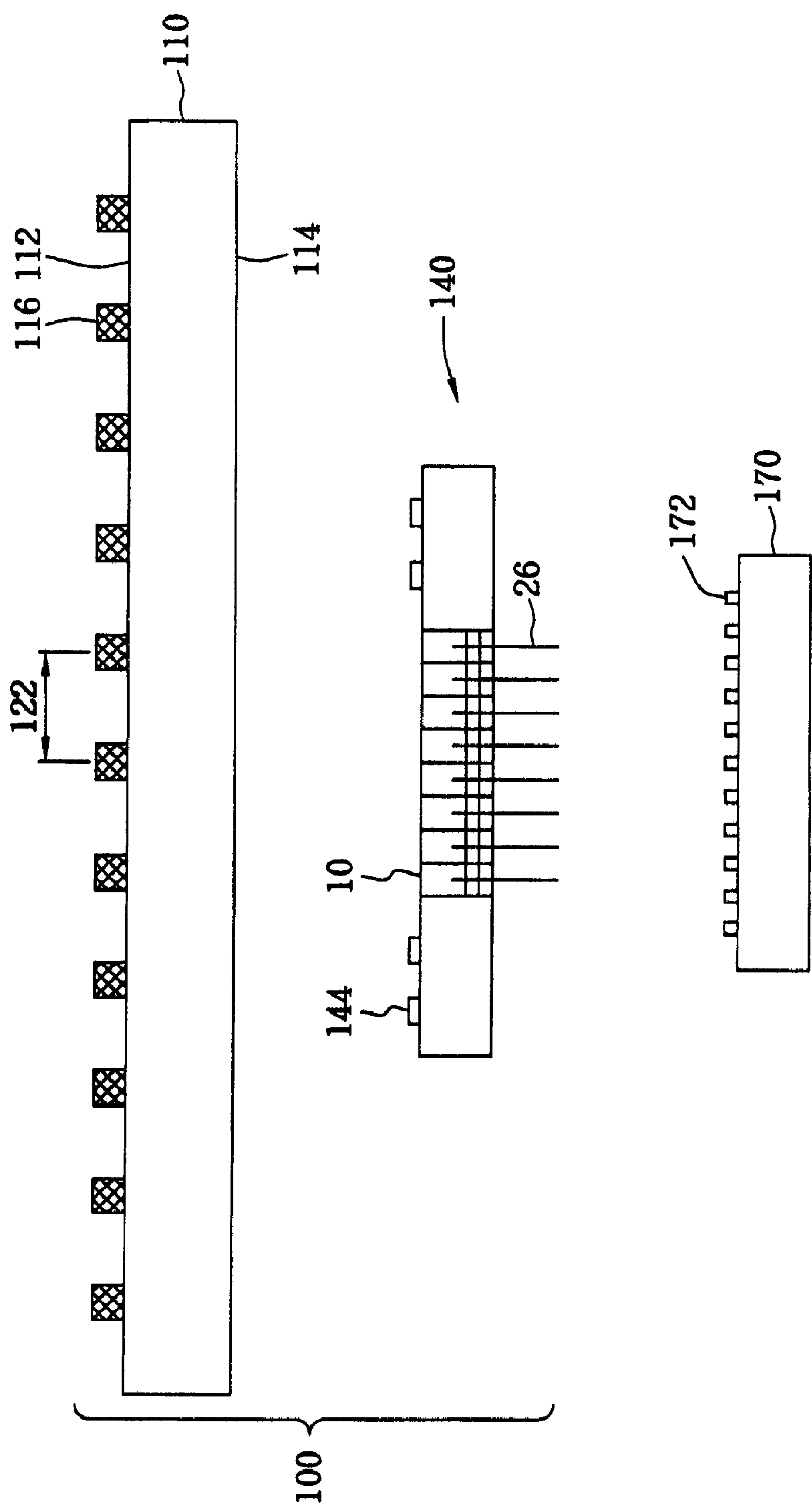
FIG. 5 is a cross-sectional diagram of a probe card according to the first embodiment of the present invention.

FIG. 5 is a cross-sectional diagram of a probe card 100 according to the first embodiment of the present invention. The probe card 100 comprises a circuit board 110 and a probe head 140. The circuit board 110 comprises a plurality of test-connecting sites 116 positioned on the upper surface 112 and a plurality of conductive paths 118 (See FIG. 8) in the circuit board 110. The plurality of test-connecting sites 116 are separated by a pitch 122 and capable of connecting to a testing machine (not shown in FIG. 5), while the conductive path 118 electrically connects the test-connecting sites 116 to the bottom surface 114 of the circuit board 110 electrically.

Figure 6:
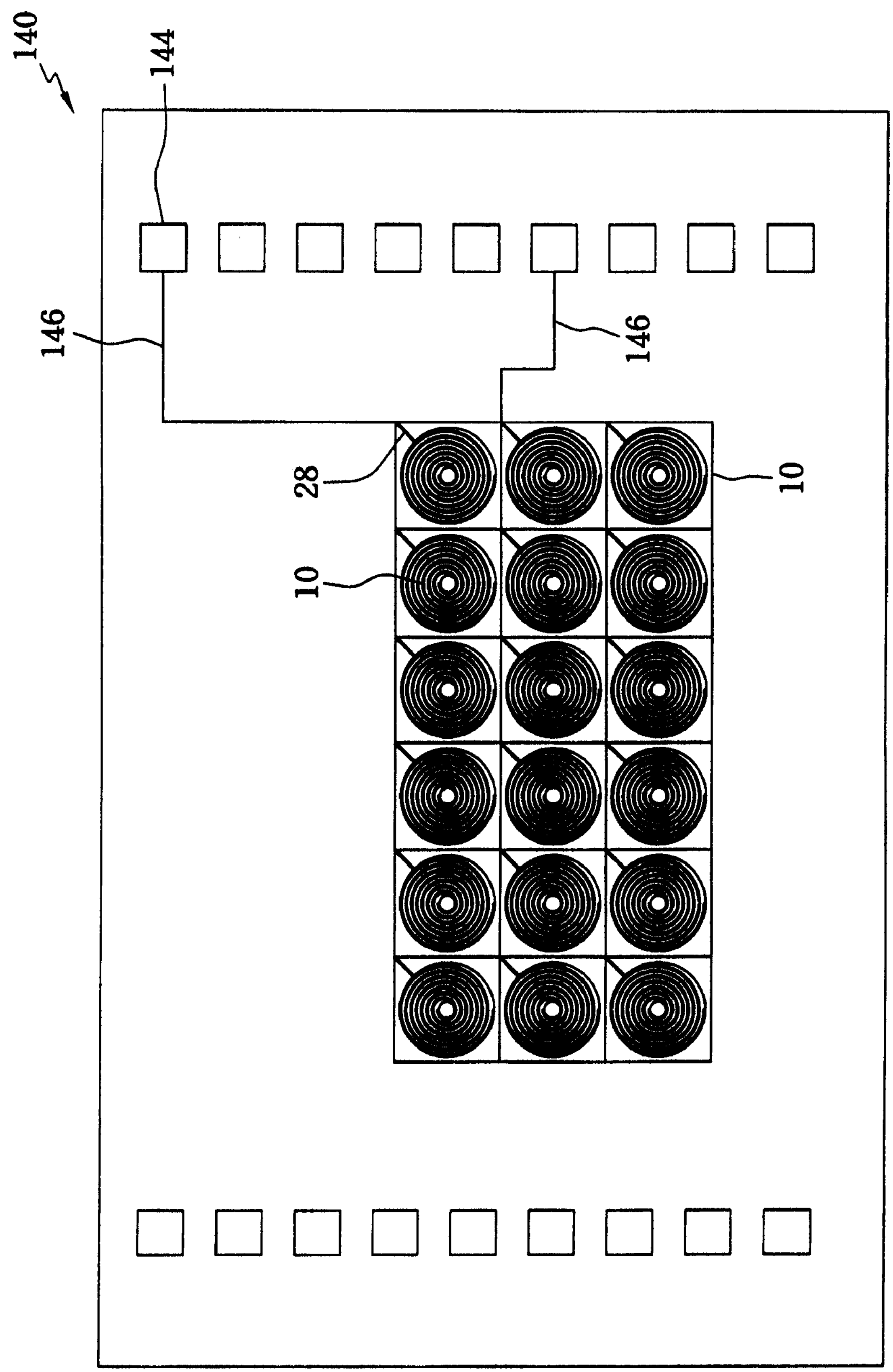
FIG. 6 is a top view of the probe card according to the first embodiment of the present invention.
Figure 7:
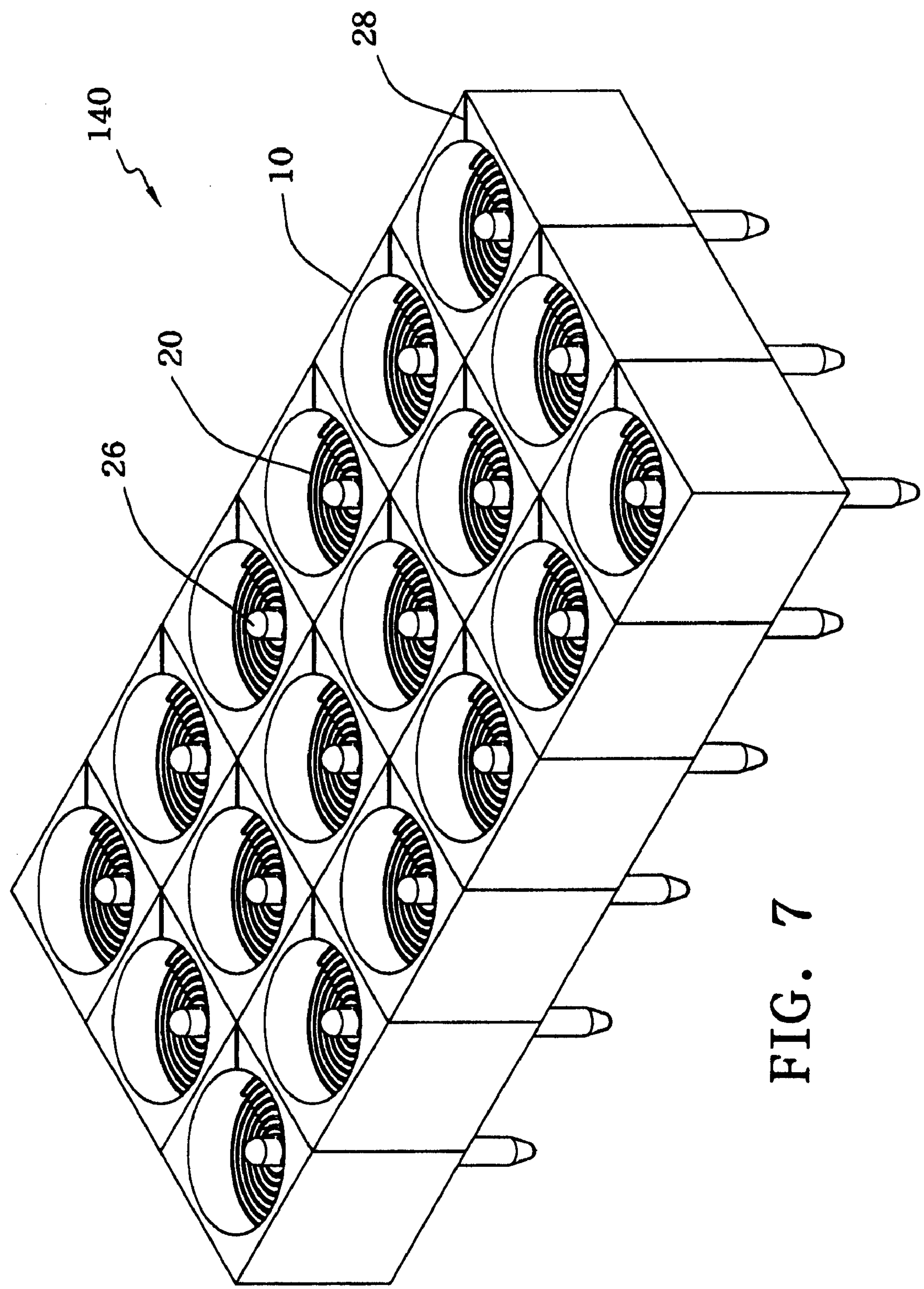
FIG. 7 is a schematic diagram of a probe head according to the first embodiment of the present invention.

FIG. 6 is a top view of a probe head 140 according to the first embodiment of the present invention. As shown in FIG. 6, the probe head 140 comprises a plurality of probe devices 10 (as shown in FIG. 1), a plurality of pads 144 and a plurality of conductive wires 146 (for clarity, only two conductive wires 146 are shown in FIG. 6) connecting the conductive wire 28 and the electrical pad 144 electrically. The arrangement of the plurality of probe devices 10 is designed to configure to the pad 172 of the integrated circuit device 170. For example, the probe devices 10 are arranged in an array of 3×6, as shown in FIG. 7.

Figure 8:
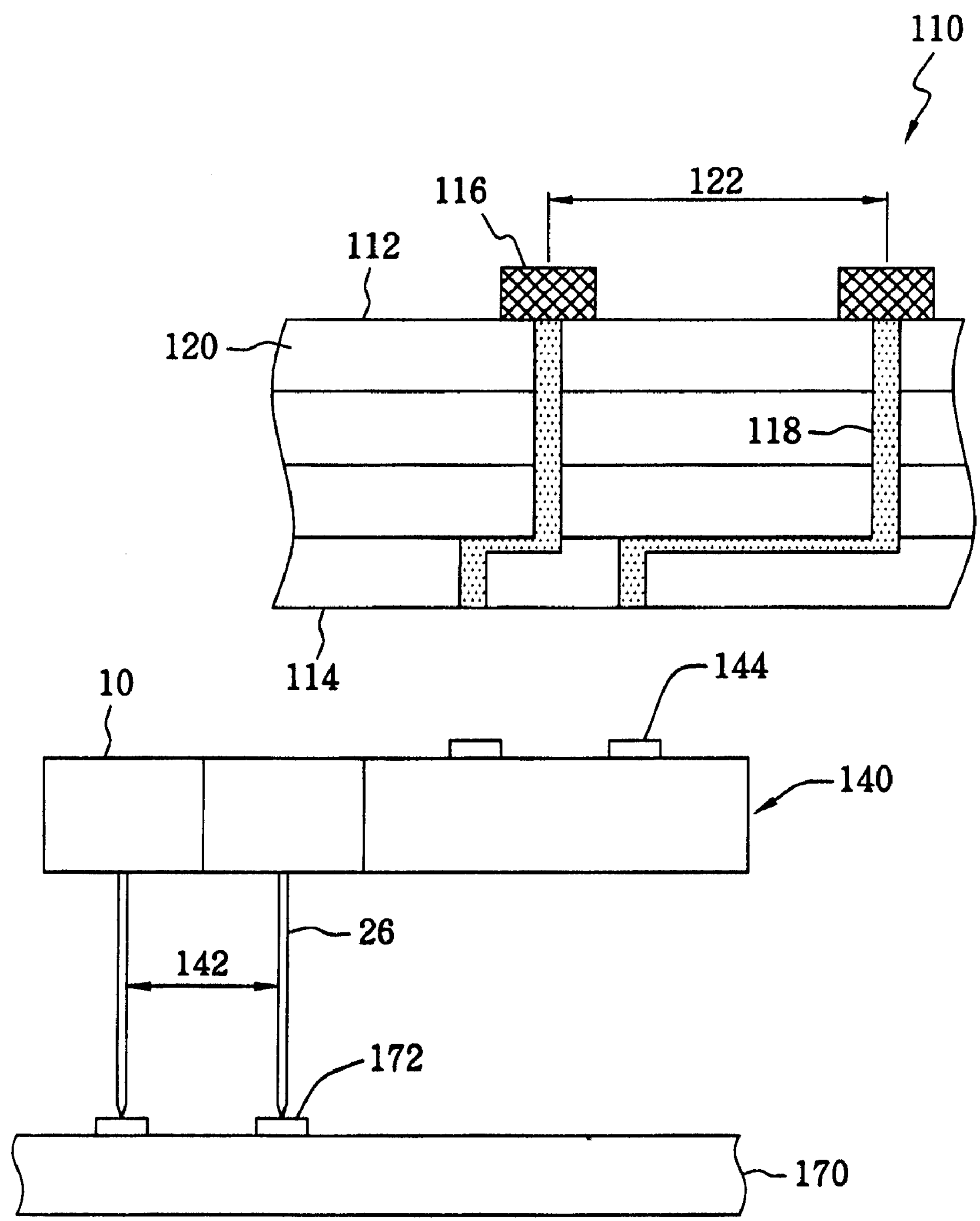
FIG. 8 is a schematic diagram showing the operation of the probe card according to the first embodiment of the present invention.

FIG. 8 is a schematic diagram showing the operation of the probe card 100 according to the first embodiment of the present invention. As shown in FIG. 8, the circuit board 110 comprises four laminates 120, and the pitch of the conductive path 118 is shrunk from the upper surface 112 to the lower surface 114 gradually. The location of the pad 144 of the probe head 140 corresponds to the conductive path 118 of the circuit board 110 so as to connect the conductive wire 28 of the probe device 10 and the conductive path 118 of the circuit board 110 electrically. The probe 26 of the probe head 140 is positioned with a pitch 142, which corresponds to the pitch separating the pad 172 of the integrated circuit device 170. The probe 26 uses the tip to contact the pad 172 electrically so as to test the electrical characteristic of the integrated circuit device 170, and the tip is capable to pierce the oxide on the surface of the pad 172 on contacting the pad 172 to avoid measurement error originating from the impedance of the oxide.

Figure 9:
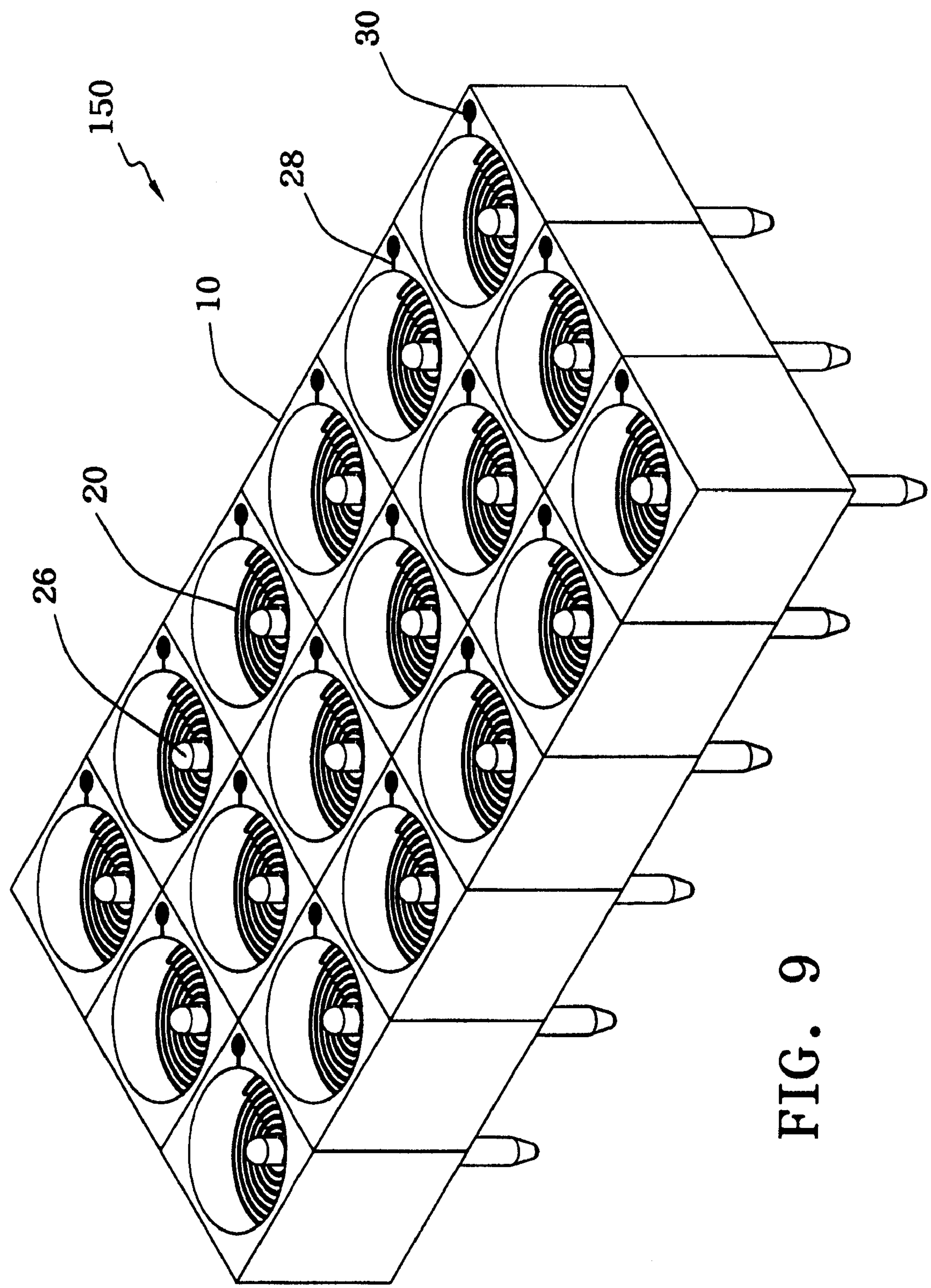
FIG. 9 is a schematic diagram of a probe head according to the second embodiment of the present invention.

FIG. 9 illustrates a probe head 150 according to the second embodiment of the present invention. As shown in FIG. 9, the probe head 150 comprises a plurality of probe devices 10 (as shown in FIG. 1), wherein each probe device 10 further comprises a pad 30 electrically connected to the conductive wire 28. The location of the pad 30 is designed to configure to the lower surface 114 of conductive path 118 of the circuit board 110 (as shown in FIG. 8) so as to connect the conductive wire 28 and the conductive path 118 electrically. Compared with the probe head 140 shown in FIG. 6, the probe head 150 obviously occupies a smaller space.

Figure 10:
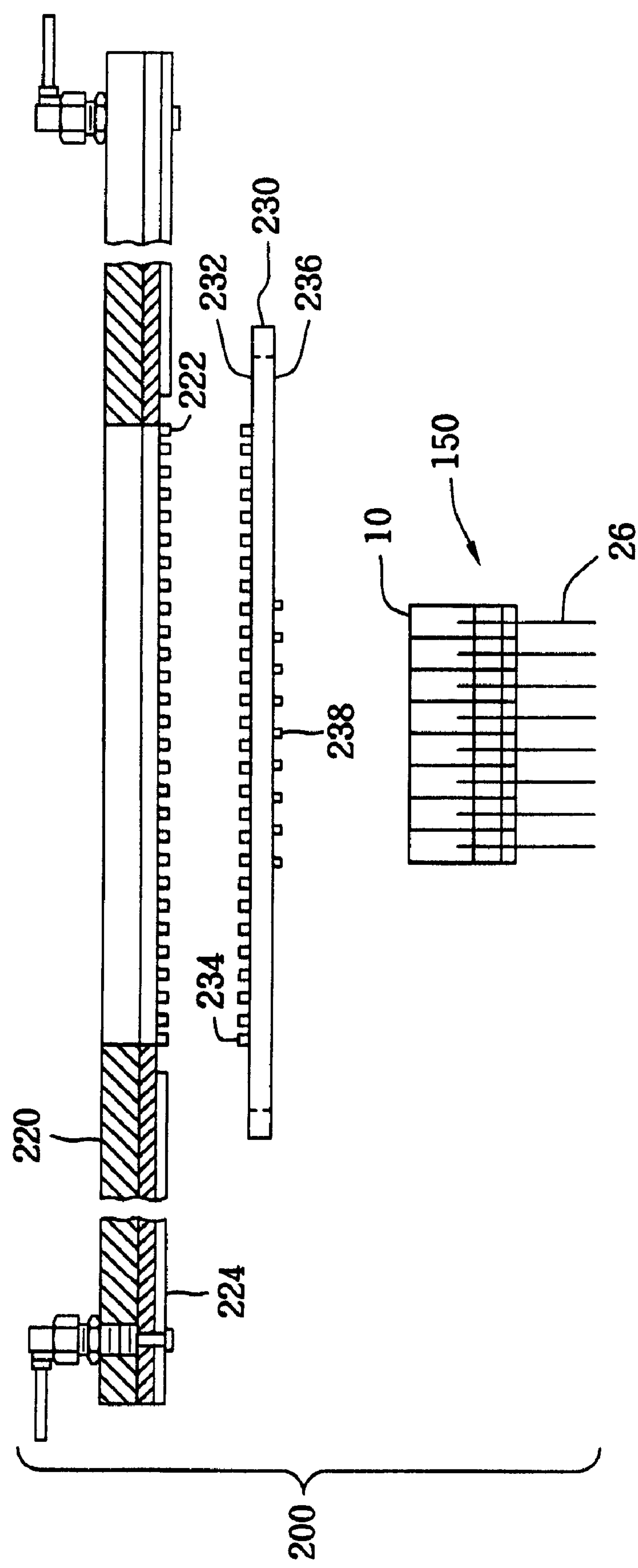
FIG. 10 is a cross-sectional diagram of a probe card according to the second embodiment of the present invention.

FIG. 10 is a cross-sectional diagram of a probe card 200 according to the second embodiment of the present invention. The probe card 200 comprises three major components; a printed circuit board 220, an interface board 230, and a probe head 150 (shown in FIG. 9). The printed circuit board 220 comprises a plurality of test-connecting sites 222 and a plurality of conductive wires 224 connecting the test-connecting site 222 to a testing machine (not shown in FIG. 10). The interface board 230 comprises a plurality of first signal-connecting sites 234 positioned on the upper surface 232, and a plurality of second signal-connecting sites 238 positioned on the bottom surface 236. The first signal-connecting sites 234 are separated by a pitch substantially the same as the pitch separating the test-connecting sites 222 of the print circuit board 220, and the second signal-connecting sites 238 is separated by a pitch less than that separating the first signal-connecting sites 234.

The position of the electrical pad 30 of the probe head 150 (as shown in FIG. 9) corresponds to that of the second signal-connecting site 238 of the interface board 230 so as to connect the conductive wire 28 of the probe device 10 and the second signal-connecting site 238 electrically. In yet another alternate embodiment, the probe card 200 can replace the probe head 150 with the probe head 140 shown in FIG. 6, wherein the position of the pad 144 of the probe head 140 (as shown in FIG. 8) corresponds to the second signal-connecting site 238 of the interface board 230 so as to connect the conductive wire 28 of the probe device 10 and the second signal-connecting site 238 electrically.

Figure 11:
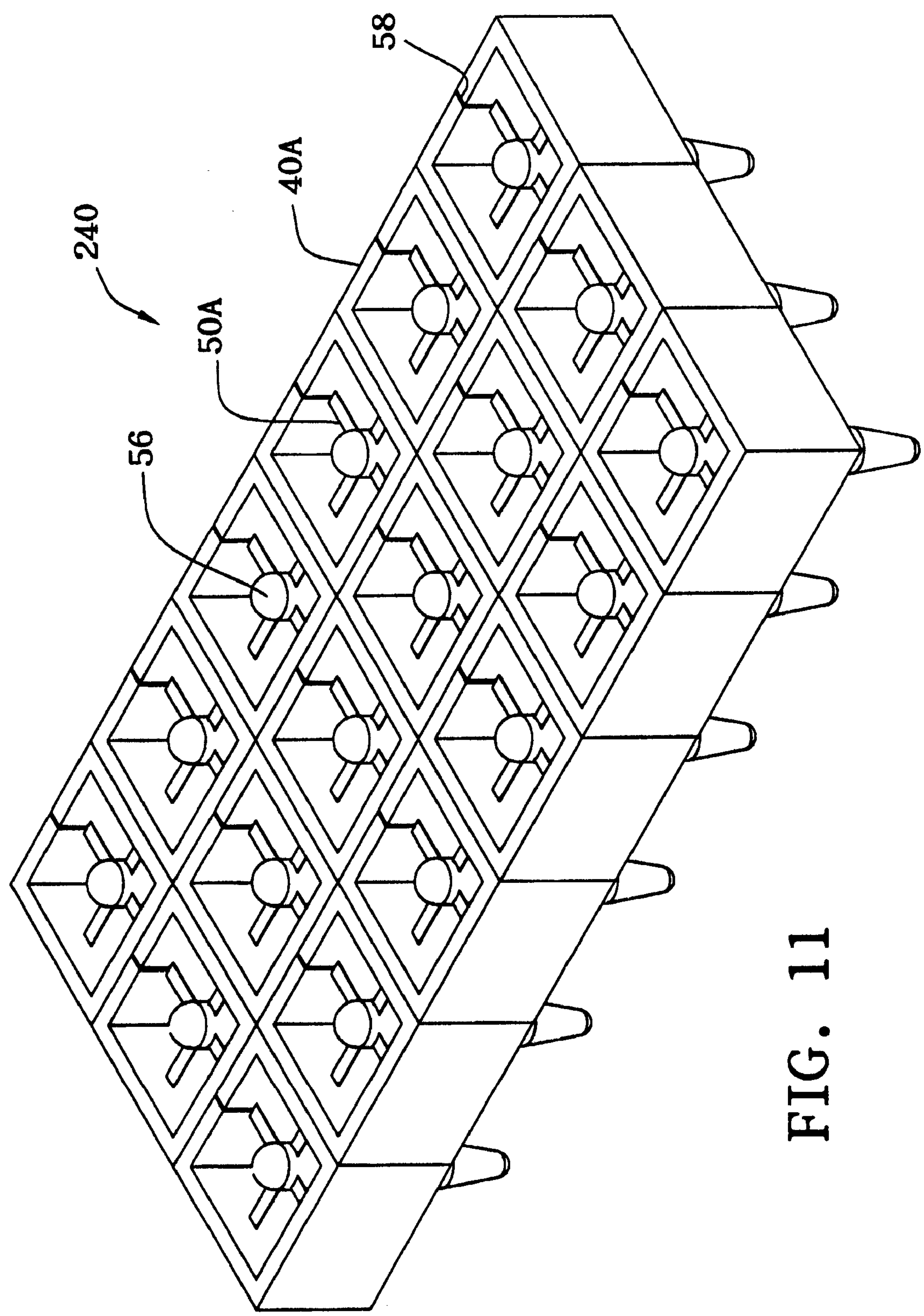
FIG. 11 is a schematic diagram of a probe head according to the third embodiment of the present invention.

FIG. 11 illustrates a probe head 240 according to the third embodiment of the present invention. As shown in FIG. 11, the probe head 240 comprises a plurality of probe devices 40A shown in FIG. 2(*a*), and the arrangement of the probe device 40A of the probe head 240 is designed to correspond to the pad of the integrated circuit device under test. In yet another alternate embodiment, the probe head 240 can consist of the probe device 40B shown in FIG. 2(*b*) or the probe device 40C in FIG. 2(*c*). The connection of the probe head 240 and a circuit board can use the design as shown in FIG. 6 or FIG. 9 alternatively to connect the conductive wire 58 to the pad of the circuit board electrically.

Figure 12:
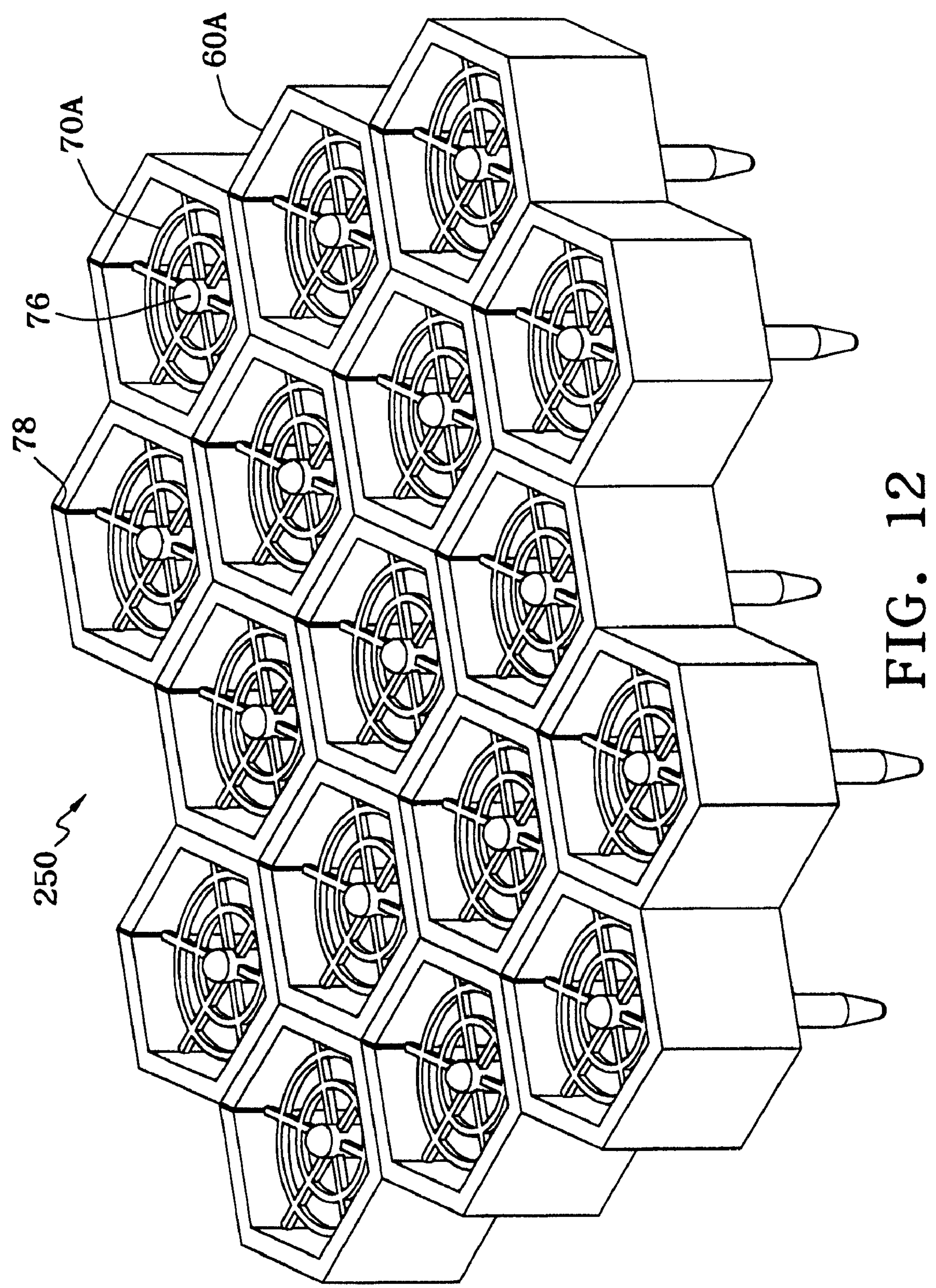
FIG. 12 is a schematic diagram of a probe head according to the fourth embodiment of the present invention.

FIG. 12 illustrates a probe head 250 according to the fourth embodiment of the present invention. As shown in FIG. 12, the probe head 250 comprises a plurality of probe device 60A shown in FIG. 3(*a*), the arrangement of the probe device 60A of the probe head 250 is designed to correspond to the pad of the integrated circuit device under test. In yet another alternate embodiment, the probe head 250 can consist of the probe device 60B shown in FIG. 3(*b*), whose supporter 70B consists of two helical springs. The connection of the probe head 250 and a circuit board can use the design as shown in FIG. 6 or FIG. 9 alternatively to connect the conductive wire 78 to the pad of the circuit board electrically.

Figure 13:
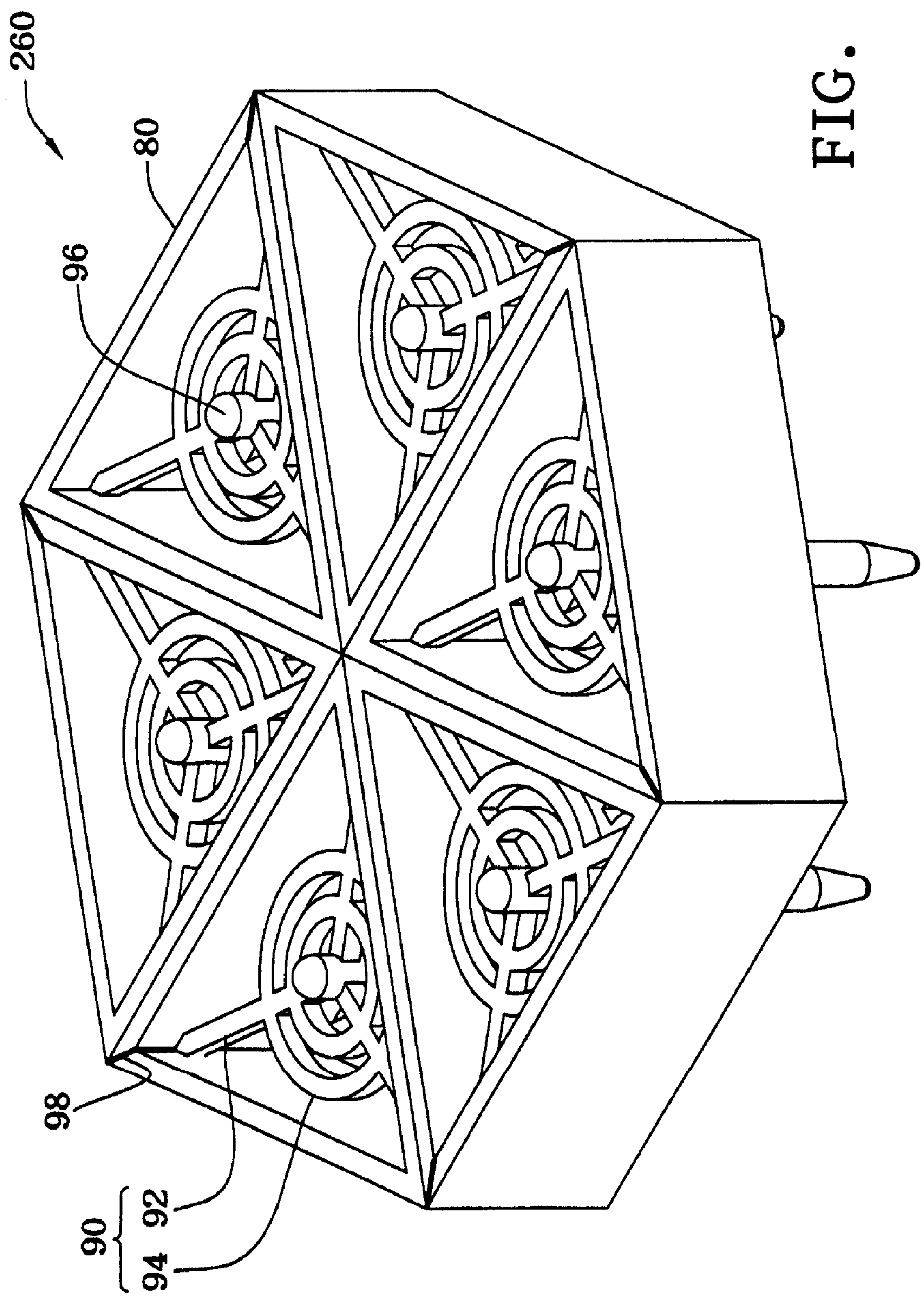
FIG. 13 is a schematic diagram of a probe head according to the fifth embodiment of the present invention.

FIG. 13 illustrates a probe head 260 according to the fifth embodiment of the present invention. As shown in FIG. 13, the probe head 260 comprises a plurality of probe devices 80 shown in FIG. 4, and the arrangement of the probe device 80 of the probe head 260 is designed to correspond to the pad of the integrated circuit device under test. The connection of the probe head 260 and a circuit board can use the design as shown in FIG. 6 or FIG. 9 alternatively to connect the conductive wire 98 to the pad of the circuit board electrically.

Compared with the prior art, the present invention possesses the following advantages:

The probe is so restricted by the lateral elasticity of the supporter that the probe is only allowed to move substantially in the vertical direction in order to avoid the lateral movement. Consequently, the present probe device enables the probe to align along the center line of the supporter automatically to ensure the lateral stability of the probe, and the probes of the probe head will neither contact with each other to cause short circuit nor generate an operational interference such as the collision.

The vertical elasticity offered by the supporter allows each probe of the probe head to move independently in the vertical direction to compensate the horizontal height difference between the pad of the integrated circuit device, and prevents the pad of the integrated circuit device from being damaged by the disproportionate probe pressure applied at the instance when the probe of the probe head contacts the pad.

The vertical and lateral elasticity of the supporter can absorb torsional stress and bending stress generated as the probe contacts the pad of the integrated circuit device to reduce fatigue and deformation of the probe. Therefore, compared with the vertical probe using the probe body deformation according to the prior art, the probe device of the present invention can prolong the probe life with the elasticity of the supporter.

The elasticity of the supporter can be designed individually; therefore, different probe pressure can be applied on the pad of the integrated circuit device by the probe of the probe head. For example, smaller probe pressure can be designed to apply on the pad around the peripheral of the integrated circuit device, while larger probe pressure can be applied at the central region to reduce unbalanced contact pressure between the probe and the integrated circuit device.

The above-described embodiments of the present invention are intended to be illustrative only. Numerous alternative embodiments may be devised by those skilled in the art without departing from the scope of the following claims.

The invention claimed is:

1. A probe device for electrical testing an integrated circuit device, the probe device comprising:
   - an insulative body including at least one opening;
   - two supporters positioned substantially in parallel with each other inside the at least one opening of the insulative body, wherein the supporter comprises a helical spring with a spiral coil extending substantially in a same plane;
   - a probe positioned substantially at a center of the supporter; wherein the probe is arranged to electrically connect to a pad of the integrated circuit device during testing; and
   - a conductive wire positioned in the insulative body and electrically connected to the supporter.

2. The probe device of claim 1, wherein the probe and the supporter each comprise a material selected from the group consisting of copper, nickel, cobalt, tin, boron, phosphorus, chromium, tungsten, molybdenum, bismuth, indium, cesium, antimony, gold, silver, rhodium, palladium, platinum, ruthenium and their alloys.

3. The probe device of claim 1, wherein the at least one opening is hexagonal.

4. A probe card for electrical testing an integrated circuit device, the probe card comprising:
   - a circuit board having at least one test-connecting site;
   - a probe head having a plurality of probe devices arranged to electrically connect to pads of the integrated circuit device when testing, wherein each of the probe devices comprises:
     - an insulative body including at least one opening;
     - two supporters positioned substantially in parallel with each other inside the at least one opening of the insulative body, wherein the supporter comprises a helical spring with a spiral coil extending substantially in a same plane;
     - a probe positioned substantially at a center of the supporter;
     - a conductive wire positioned in the insulative body and electrically connected to the supporter; and
   - an interface board, comprising:
     - at least one first signal-connecting site positioned on an upper surface of the interface board for electrically connecting the test-connecting site of the circuit board; and
     - at least one second signal-connecting site positioned on a bottom surface of the interface board for electrically connecting the conductive wire of the probe head.

5. The probe card of claim 4, wherein the probe and the supporter each comprises a material selected from the group consisting of copper, nickel, cobalt, tin, boron, phosphorus, chromium, tungsten, molybdenum, bismuth, indium, cesium, antimony, gold, silver, rhodium, palladium, platinum, ruthenium and their alloys.

6. A probe card for electrical testing an integrated circuit device, the probe card comprising:
   - a circuit board, comprising:
     - a plurality of test-connecting sites; and
     - a plurality of conductive paths for connecting the test-connecting sites to the bottom surface of the circuit board; and
     - a probe head comprising a plurality of probe devices, wherein each of the plurality of probe devices comprises:
     - an insulative body including at least one opening;
     - two supporters positioned substantially in parallel with each other inside the at least one opening of the insulative body, wherein the supporter comprises a helical spring having a spiral coil extending substantially in a same plane;
     - a probe positioned substantially at a center of the supporter; and
     - a conductive wire positioned in the insulative body and electrically connected to the supporter and an associated conductive path of the circuit board.

* * * * *